UHF TUNER

Filed Jan. 14, 1965 2 Sheets-Sheet 1

Inventors:
Joseph Naber
Merrill J. Fox
Edward D. Chalmers
John Y. Ma
John G. Cummings
Norman D. Cappelle
By Hofgren, Wegner,
Allen, Stellman & McCord Att'ys March 7, 1967 J. NABER ET AL 3,307,414
UHF TUNER
Filed Jan. 14, 1965 2 Sheets-Sheet 2
Fig. 3. Fig. 4.
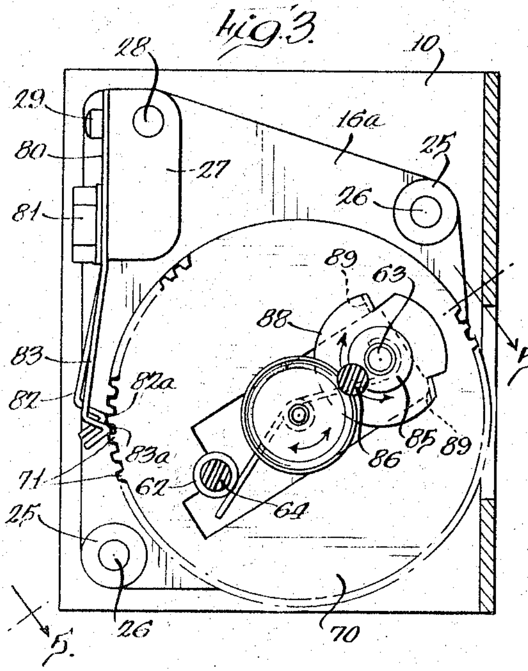
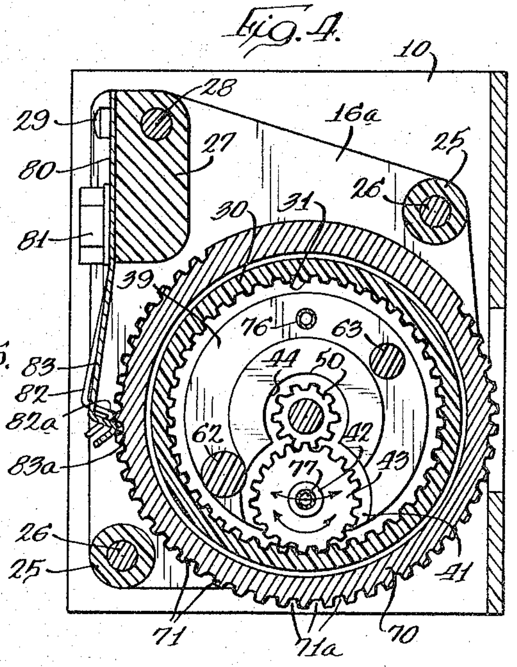
Fig. 5. Fig. 6.
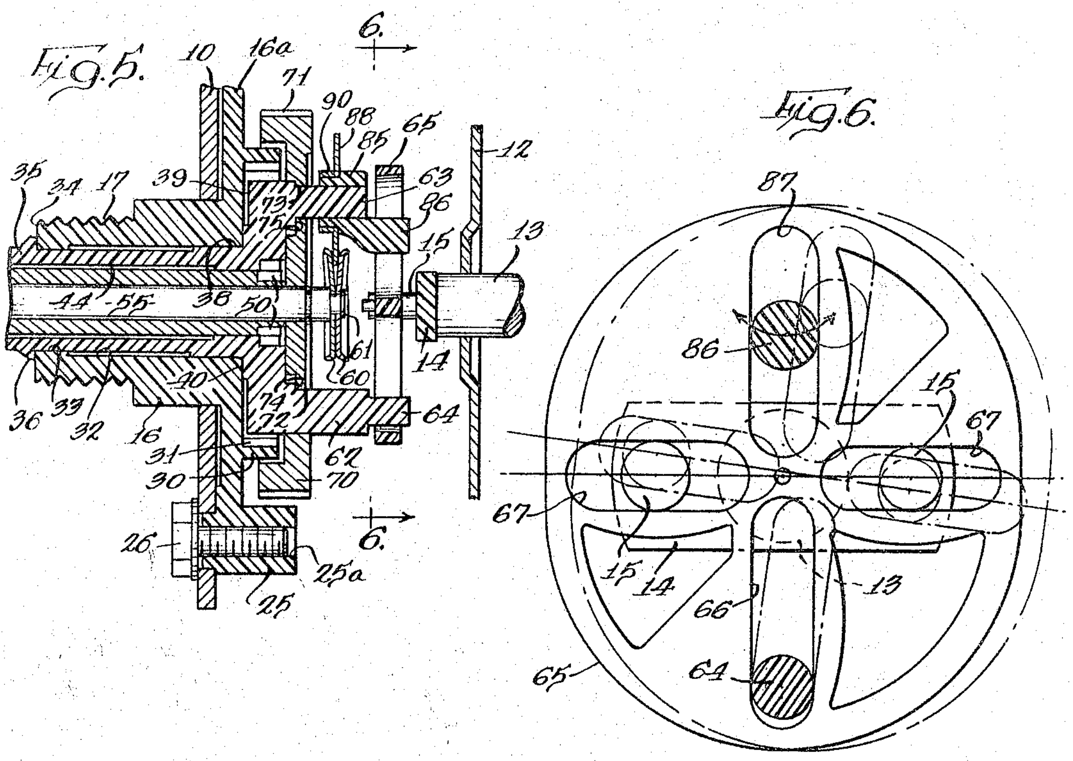

United States Patent Office 3,307,414

Patented Mar. 7, 1967

3,307,414

UHF TUNER

Joseph Naber, Marengo, Merrill J. Fox, Fox River Grove, Edward D. Chalmers, Crystal Lake, John Y. Ma, Algonquin, John G. Cummings, Cary, and Norman D. Cappelle, Arlington Heights, Ill., assignors to Oak Electro/Netics Corp., a corporation of Delaware Filed Jan. 14, 1965, Ser. No. 425,565

21 Claims. (Cl. 74—10.41)

This invention relates in general to a television tuner, and more particularly to a UHF tuner which is to be used in selecting channels in the UHF range.

The UHF television band, from 470 megacycles to 890 megacycles, is of increasing importance as available VHF channels are placed in use. The UHF band provides seventy television channels (Channel 14–Channel 83), each occupying a six megacycle band of the spectrum. Various types of tuning devices have been proposed for use in the UHF range, generally using some form of continuously variable tuning element. However, none has been completely commercially satisfactory. One of the major drawbacks of known types of UHF tuner is that none of them have provided means for positively locking the channel selecting means at each of the UHF channels. Because of the large number of channels in the UHF band, and because of the necessity of providing a compact tuner construction, detent means which would positively lock the channel selecting means at each channel or for groups of channels in the UHF range have not heretofore been practical.

In providing a detented UHF tuner, those skilled in the art were faced with many apparently insolvable problems. For example, in order for the person selecting the channel to have the proper "feel" while still providing a compact tuner design, it was thought necessary to provide an extremely heavy spring which would bias detent means into engagement with suitable abutments on an indexing mechanism. When a heavy spring is provided, a rather large torque is necessary to overcome the inertia of the elements and start the movement of the channel selecting means. Because of the necessity of the rather large starting torque when using a heavy spring, it has not been possible to tune adjacent channels, and there has been a pronounced tendency for the channel selecting means to overshoot a desired adjacent channel. When a rather light spring has been used to avoid the "overshoot" problem, inadequate "feel" has been provided for a person using the tuner. Accordingly, it has heretofore been concluded by those skilled in the art that a detented UHF tuner was not practical, and thus it has been common in the prior art to use a non-detented type of tuner having dial stops only at the ends of the UHF band. This type of tuner has the obvious drawbacks of no locking in of the channel selector means at each channel, no positive feeling of changing from one channel to another, and the necessity of tuning through the entire UHF band when it is desired to go from one end of the band to the other.

Accordingly, the general purpose of the present invention is to provide a detented UHF tuner.

An object of the present invention is to provide a UHF tuner with an improved index mechanism for positively locating the channel selecting means at each channel in the UHF band.

Another object of the invention is to provide a detented UHF tuner with a constant angular increment drive for the channel selecting mechanism so that each of the channels will be accurately selected.

A further object of the invention is to provide a detented UHF tuner which will positively lock the channel selecting means at each of the channels in the UHF range, and wherein the channel selector means is relatively easy to turn so that adjacent channels can be selected without over-shooting.

Still another object of the invention is to provide a detented UHF tuner as described in the preceding paragraph with novel drive means for accomplishing the changing of channels in the UHF band.

Yet a further object of the invention is to provide a detented UHF tuner with novel fine tuning means for the accurate tuning of each of the channels in the UHF band.

And another object of the invention is to provide novel means for coupling the channel selecting means of a detented UHF tuner with the rotor shaft of the tuner.

Other objects and advantages will become readily apparent from the following description taken in connection with the accompanying drawings, in which:

FIG. 3 is asectional view taken generally along line 3—3 of FIG. 2;

FIG. 4 is a sectional view taken generally along line 4—4 of FIG. 2;

FIG. 5 is a sectional view taken generally along line 5—5 of FIG. 3; and

FIG. 6 is an enlarged sectional view taken generally as shown along line 6—6 of FIG. 5.

Figure 1:
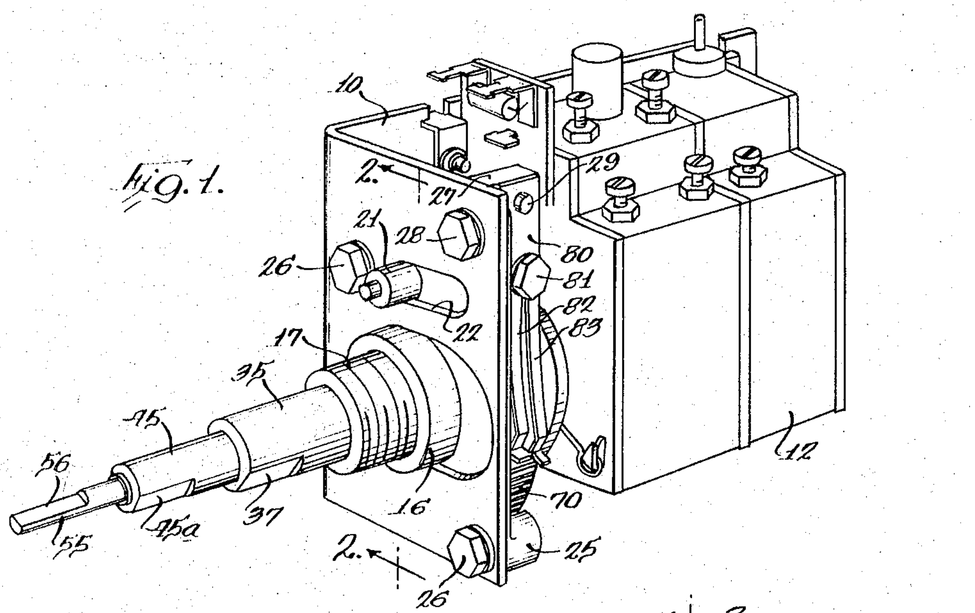
FIG. 1 is a front perspective view of a preferred embodiment of the invention.

While a preferred embodiment of the invention is shown in the drawings and will be described in detail herein, the invention is susceptible of embodiment in many different forms and it should be understood that the present disclosure is to be considered as an exemplification of the principles of the invention and is not intended to limit the invention to the embodiment illustrated. The scope of the invention will be pointed out in the appended claims.

Figure 2:
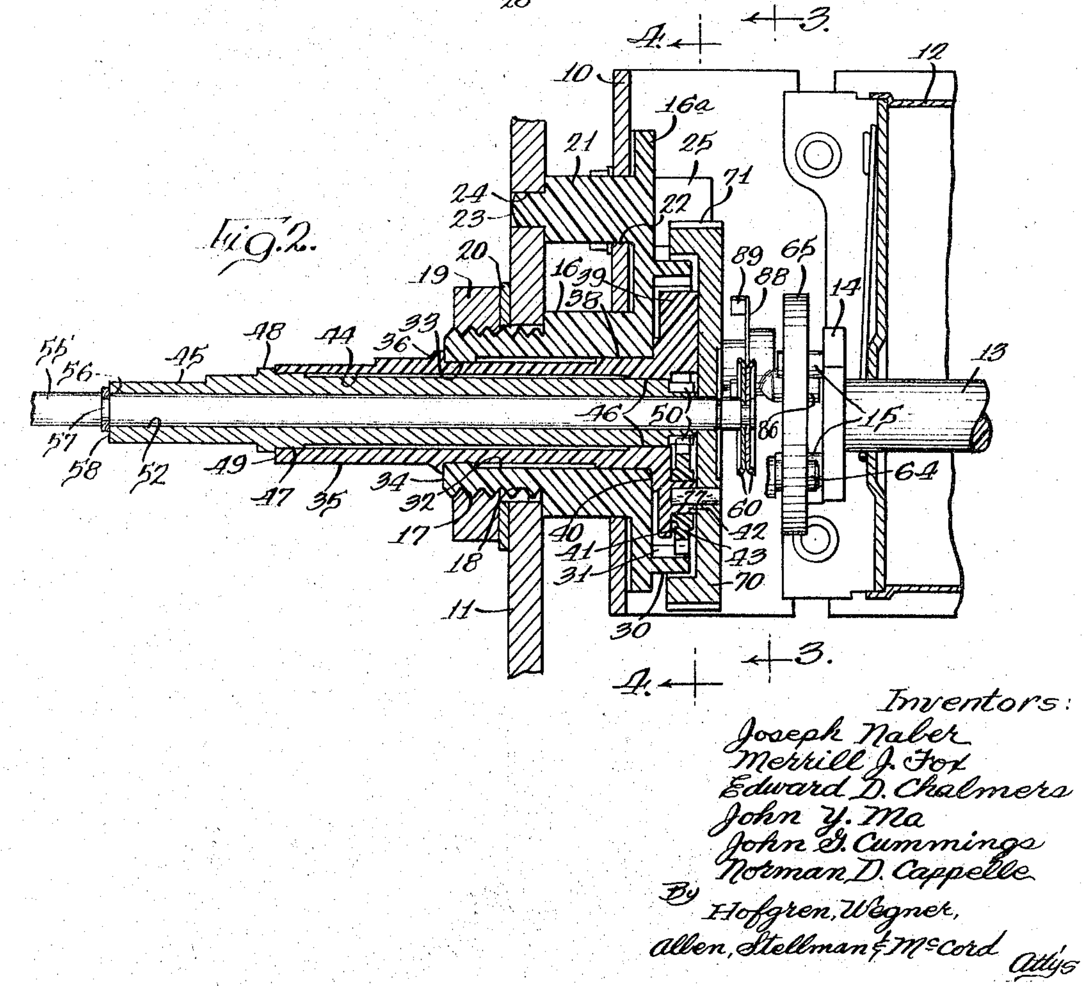
FIG. 2 is a sectional view taken generally along line 2—2 of FIG. 1 with certain parts broken away for clarity.

The illustrated embodiment of the UHF turner includes a generally L-shaped mounting bracket 10 which is adapted to be secured to the chassis 11 (FIG. 2) of a television receiver. The tuner circuitry is located in a box-like housing 12 that is secured to the tuner frame, and exemplary forms of suitable circuitry are disclosed in the copending application of Chalmers et al., Serial No. 288,208, filed June 17, 1963, and assigned to the assignee of this application. A rotor shaft 13 extends longitudinally through the housing 12 and cooperates with the continuously variable turner circuitry to control the frequency of operation of the tuner, as is described in detail in the above mentioned patent application. As can be best seen in FIGS. 2 and 5, shaft 13 extends forwardly out of housing 12, and an enlarged, generally rectangular portion 14 (FIG. 6) is formed integrally with the shaft at generally right angles to the axis thereof. A pair of generally cylindrical studs 15 are formed integrally with shaft portion 14, and extend forwardly from the front face thereof. As can be best seen in FIG. 6, studs 15 are spaced substantially equally from the rotational axis of shaft 13, and are disposed in substantial parallelism therewith. Studs 15 are coupled to the channel selector means to be hereafter described, to secure the channel selector means and the rotor 13 for rotation together.

The means for mounting the channel selector means upon the chassis 11 includes a bushing 16 having a reduced threaded portion 17 inserted through a suitable hole 18 in the chassis. A washer 20 on bushing 16 abuts the front face of chassis 11, and a nut 19 is threaded onto reduced portion 17 to fix bushing 16 securely to the chassis. Bushing 16 includes an enlarged flange 16*a* which is positioned adjacent the rear face of the front portion of bracket 10 and an eccentric pin 21 is formed integrally with bushing flange 16*a*, and extends forwardly through a suitable opening 22 in bracket 10. As can be best seen in FIG. 2, pin 21 includes an end portion 23 of reduced diameter which is received in an opening 24 in chassis 11, to lock bushing 16 against rotation. Bosses 25 extend rearwardly from flange 16*a*, and are provided with longitudinally extending bores 25*a*. Self threading screws 26 extend into openings 25*a*, securing the flange 16*a* to the frame 10. As can be best seen in FIGS. 3 and 4, a generally rectangularly shaped mounting block 27 extends rearwardly from the rear face of flange 16*a*. A self-threading screw 28 extends through openings in flange 16*a* and block 27 to secure the upper portion of flange 16*a* to frame 10. A generally cylindrical pin 29 extends outwardly from the side of mounting block 27 to provide an anchor for the detent means to be hereafter described.

An annular ring 30 extends rearwardly from the rear face of flange 16*a*, and is positioned in general concentric relationship with the bore 32 of bushing 16. A plurality of gear teeth 31 are provided on the inner face of ring 30, and collectively define an internal gear which is concentric with bore 32.

Bore 32 is counter bored to define a portion 33 of reduced diameter adjacent the forward end of bushing portion 17 which serves as a first bearing point for an indicator shaft or carrier member 35. The outer periphery of indicator shaft 35 includes an enlarged portion 36 which abuts against the forward face 34 of bushing portion 17 to locate the indicator shaft with respect to the bushing and to retain the indicator shaft against longitudinal movement in one direction. As can be best seen in FIG. 1, indicator shaft 35 may be provided with a flattened portion 37 for reception of an indicator dial, not shown. An intermediate portion of indicator shaft 35 is enlarged, as shown at 38 in FIG. 2 and FIG. 5, and bears against the bore 32 in bushing 16 to provide a second bearing point for the indicator shaft 35. It will be understood, of course, that bushing 16 and indicator shaft 35 are preferably formed of a smooth material, such as nylon or the like, so that they are free to rotate relative to one another with minimum friction.

The rearward end of indicator shaft 35 includes an enlarged annular flange 39 that is disposed at right angles to the axis of the shaft. A shoulder 40 is provided on the front face of the flange 39, and abuts against the rear face of bushing 16 to cooperate with shaft portion 36 and fix the indicator shaft against longitudinal movement relative to the bushing. The rear face of flange 39 is provided with a portion of reduced thickness 41, as can be best seen in FIGS. 2 and 4, and a planet gear 43 is rotatably mounted on a stud 42 that is positioned generally centrally within the area of reduced thickness 41. Gear 43 meshes with the internal gear formed by teeth 31, and is adapted to be driven therearound by means to be hereafter described.

Indicator shaft 35 includes a longitudinally extending bore 44 which is concentric with bushing 16. Bore 44 is counterbored to provide a portion of reduced diameter 46, which serves as a first bearing point for a broad tuning shaft 45 that is rotatably mounted within the indicator shaft 35. The intermediate portion of broad tuning shaft 45 includes a portion of enlarged diameter 47, which is rotatably mounted in bore 44, and serves as a second bearing point for shaft 45. An enlarged shoulder 48 on shaft 49 engages the forward end 49 of shaft 35 to prevent longitudinal movement of shaft 45 in one direction relative to shaft 35. Shaft 45 may be provided with a flattened portion 45*a* FIG. 1, for reception of a knob, not shown, for manual operation of the shaft. A gear 50 is formed integrally with the rearward end of shaft 45, and meshes with gear 43, as can be best seen in FIG. 4. Thus, as broad tuning shaft 45 is rotated, gear 43 will ride around the periphery of the internal gear formed by teeth 31, and the indicator shaft 35 will rotate relative to the broad tuning shaft 45, and relative to the bushing 16.

Broad tuning shaft 45 includes a longitudinally extending bore 52 which is concentric with indicator shaft 35 and bushing 16. A fine tuning shaft 55 is rotatably mounted in bore 52, and includes a flattened portion 56 for reception of a manually operable knob, not shown. A C-washer 56 is positioned in an annular groove 57 in fine tuning shaft 55, and abuts against the front face 58 of broad tuning shaft 45 to lock the broad tuning shaft against longitudinal movement outwardly of the assembly, and to lock fine tuning shaft 55 against longitudinal movement inwardly of the assembly. Drive means are secured to the rear end of shaft 55 that extends outwardly of shafts 35 and 45, and in the illustrated embodiment comprise a pair of adjacent plates 60 which are formed of a high friction material. The end portion of shaft 55 may be peened over as at 61 in FIG. 5, to retain the drive plates 60 on the shaft.

Means are provided for coupling the broad tuning shaft 45 to the rotor 13 for rotation thereof, and include a pair of generally cylindrical studs 62 and 63 extending rearwardly from the rear face of the flange 39 of the indicator shaft 35. The rearward end of stud 62 terminates in a cylindrical portion of reduced diameter 64 which extends into one radial slot 66 in a coupling plate 65. As can be best seen in FIG. 6, the studs 15 on rotor 13 extend into diametrically opposed radially extending slots 67 in coupling disc 65, so that upon rotation of broad tuning shaft 45 and the subsequent rotation of indicator shaft 35 through the drive of the planetary gear system, stud 64 will drive the coupling plate 65, and thus the rotor 13 will be rotated. It will be understood, of course, that the tunable components located in housing 12 are controlled by the rotation of the rotor 13 to tune in different channels in the UHF band. Detent means, to be immediately hereafter described, are provided to positively locate the tuning components in the proper position when the broad tuning shaft has been rotated through a predetermined angle.

The detent means includes disc 70 that is provided with apertures 72 and 73 which receive studs 62 and 63, respectively, to mount disc 70 for rotation with indicator shaft 35. Disc 70 fits over shoulders 74 and 75 (FIG. 5), which are provided on studs 62 and 63, respectively, and is seated against the rear face of indicator shaft 35. Driving studs 76 and 77 (FIG. 4) frictionally hold the disc to the shaft. The outer periphery of index disc 70 is provided with a plurality of spaced outwardly facing teeth or ridges 71, which define recess portions 71*a* therebetween. In the illustrated embodiment, thirty-five recesses 71*a* are provided, with each recess 71*a* and each ridge 71 corresponding to one of the channels in the UHF band.

A detent member 80 is provided with an aperture which is received on anchor stud 29, and extends downwardly from mounting block 27 in a direction which is generally tangential to index disc 70. A screw 81 passes through a suitable opening in detent member 80, and is threaded into a hole in mounting block 27 to retain detent member 80 against the side of the mounting block. As can be best seen in FIGS. 1, 3 and 4, detent member 80 includes two downwardly extending, spaced spring fingers 82 and 83 which are biased into engagement with the outer periphery of index disc 70. Fingers 82 and 83 terminate in abutments 82*a* and 83*a* which are each positioned for engagement with each ridge 71 and each recess portion 71*a*. As can be best seen in FIGS. 3 and 4, abutments 82*a* and 83*a* are spaced by a distance corresponding to one-half of the distance between adjacent ridges 71 so that one abutment is engaging a recess, while the other abutment is engaging a ridge. Thus, each ridge and each recess define an index station which corresponds to one channel in the UHF band. Each of the abutments 82*a* and 83*a* will engage each of the index stations as the index disc 70 is rotated. However, the engagement of one of the abutments with one of the recesses will lock the index disc at the appropriate selected channel. It will be readily understood that by providing more than one detent member, a smaller number of teeth may be provided on the index disc, and thus the teeth will be more widely spaced apart, and will be inherently stronger. It should be understood, of course, that the present invention is not intended to be limited to the use of two spring fingers, and contemplates that more spring fingers may be provided, with a corresponding decrease in the number of the teeth on the index disc. For example, five spring fingers could be provided, together with fourteen teeth in the index disc, and this arrangement would function satisfactorily to provide an index station for each of the seventy channels in the UHF range.

The means for fine tuning the selected channel which has been selected by actuation of the broad tuning shaft 45, will be best understood from a consideration of FIGS. 3, 5 and 6. A sleeve 85 is rotatably positioned on stud 63 and includes an eccentric pin 86, which is axially offset from stud 63. Pin 86 extends into a radial slot 87 in coupler plate 65, and is adapted to pivot the coupler plate 65 about the stud portion 64 when the sleeve 85 is rotated on stud 63 (FIG. 6). Thus, a desired fine tuning range may be imparted to rotor 13. Means are provided for rotatably coupling sleeve 85 with fine tuning shaft 55, and includes a frictionally driven plate 88 which is adapted to drivingly engage between drive plates 60. Driven plate 88 is preferably provided with a square bore portion as at 90 in FIG. 5, which cooperates with a corresponding square portion on sleeve 85 to nonrotatably couple the driven plate 88 with the sleeve 85. Thus, as fine tuning shaft 55 is rotated, the drive plates 60 will engage on opposed sides of the driven plate 88, and through the frictional engagement between their mating surfaces, sleeve 85 and eccentric pin 86 will be rotated to impart the desired fine tuning action to the rotor 13. Driven plate 88 is preferably provided with bent over tabs as at 89 (FIG. 3), which are engageable with the drive plates 60 to provide stops for limiting the angular movement of the driven plate, to provide a predetermined fine tuning range.

In a preferred embodiment, the indexing is accomplished over a 270° span of index disc 70. For this purpose, thirty-five grooves 71a are provided in the outer periphery of the discs 70, and each groove is thus spaced 7.826° apart. Accordingly, because of the dual detent spring arrangement, there is 3.913° of rotation of index disc 70 for each index station corresponding to a particular channel in the UHF range. In the preferred embodiment, gear 50 has ten teeth, gear 43 has nineteen teeth, and the internal gear includes forty-eight gear teeth 31. The tuning ratio between the index disc 70 and the broad tuning shaft 45, through the planetary gear system, is 5.8 to 1, so that it will be necessary to rotate the broad tuning shaft 45, 22.6954° to change from one channel in the UHF band to an adjacent channel in the UHF band. The rather large tuning angle of the broad tuning shaft provides a positive feel to the person selecting a channel, and thus it is not necessary to use heavy detent springs 82 and 83. Accordingly, less force will be imparted to the teeth 71 on the indexing disc 70, and a durable construction is provided.

The novel mechanical features of the indexed drive mechanism can be utilized with detents for a group of adjacent UHF channels, provided the fine tuning control has sufficient range to tune across the group of channels.

The detent mechanism is directly coupled with the tuner rotor, without intermediate gearing, avoiding inaccuracies due to backlash.

The tuning elements of the UHF tuner are quite linear so that a given angular movement of rotor 13 effects the same absolute variation of frequency throughout the tuning range. The slotted coupling plate 65 imparts the accurate angular increments of the detent mechanism to the tuner rotor regardless of slight axial or angular misalignment.

We claim:

1. A UHF tuner for selecting channels in the UHF range comprising: a frame; a housing on said frame and containing electrical components for each of said channels; selectively operable channel selecting means carried by said frame; an indexing mechanism carried by said frame and including an index member rotatable in opposite directions on said frame and having a plurality of detent coacting means, each of said detent coacting means defining a pair of index stations, each of said index stations corresponding to one UHF channel; and detent members carried by said frame and alternately engageable with said detent coacting means to lock said channel selecting means at a desired channel, and means coupling said channel selecting means and said index member.

2. A UHF tuner, comprising: a tuner having a single control element, rotatable to effect a tuning change throughout the channels in the UHF range; a broad tuning member; a fine tuning member coaxial with said broad tuning member; coupling means connecting said broad tuning member with said control element; a detent mechanism connected with said broad tuning member and having detent index positions related to the UHF channels; and means independent of said detent mechanism connecting said fine tuning member with said control element to adjust the tuning of said tuner without disturbing the index position of said detent mechanism.

3. The UHF tuner of claim 2 wherein said coupling means includes a coupling member, and a stud engaged in said coupling member, and said means connecting the fine tuning member with the control element includes eccentric means for rocking said coupling member about said stud.

4. A tuner for selecting one of a plurality of television channels comprising: a frame; tuning components carried by said frame; a rotor rotatably mounted on said frame and adapted to control said components; a pair of studs extending outwardly from said rotor; a carrier member rotatable on said frame and having a pair of spaced studs extending outwardly from one face thereof; a disc having a plurality of index stations, each corresponding to one of said television channels; a pair of openings in said disc through which carrier studs extend to mount said carrier member and said disc for rotation together; a coupling plate having radial slots, said rotor studs each being received in different ones of said slots, and at least one of said carrier studs being received in another one of said slots; a detent carried by said frame and positioned for engagement with said index stations upon rotation of said index disc relative to said detent; and means for rotating said carrier member to position said detent in a desired index station.

5. An indexing device comprising: a support; an index member rotatable in opposite directions relative to said support, said member having means providing a plurality of index stations; detent members on said support, each detent member being positioned for engagement one at a time with each of said index stations upon relative movement between said index member and said detent members; and means separate from said detent members for rotating said index member relative to said detent members to position one of said detent members in a desired index station.

6. An indexing device comprising: a support; an index disc rotatable in opposite directions, on said support said disc having a plurality of index stations; at least two detent members on said support, each detent member being positioned for engagement one at a time with each of said index stations upon relative movement between said disc and said detent members; and means separate from said detent members for rotating said disc to position one of said detent members in a desired index station.

7. An indexing device comprising: a support; an index disc rotatable in opposite directions, on said support said disc having a plurality of index stations; a detent on said suport and having spaced detent fingers, said fingers being positioned alongside one another alternately to engage one of said index stations upon relative movement between said disc and said detent; and means separate from said detent for rotating said disc to selectively position one of said detent fingers in a desired index station.

8. An indexing device comprising: a support; an index disc mounted on said support for rotation in opposite directions, said index disc having a plurality of peripheral index stations; detent members non-rotatably mounted on said detent support, said detent members being positioned for alternate engagement with said index stations upon relative movement between said disc and said detent members; and means separate from said detent members for rotating said disc to position one of said detent members in a desired index station.

9. The indexing device of claim 8 wherein said rotating means includes a shaft extending at right angles to the plane of said disc, and said index stations are defined by notches in said disc which are disposed at right angles to the plane of said disc.

10. An indexing device comprising: a support; a flat disc mounted on said support for rotation in opposite directions, said disc having a plurality of peripheral notches extending at right angles to the faces of said disc and defining index stations; a detent on said support and having a pair of spaced spring fingers, said fingers being positioned alongside one another and extending generally tangentially to said disc, said fingers each having an abutment positioned for engagement with each of said notches upon rotation of said disc and being spaced by a distance corresponding to one-half the distance between adjacent notches so that said fingers will alternately engage said notches; and means separate from said detent for rotating said disc to position one of said abutments in a desired notch.

11. A tuner for selecting one of a plurality of television channels comprising: a frame; tuning components carried by said frame; a rotor mounted on said frame for rotation in opposite directions and controlling said components; an index member having a plurality of index stations, each corresponding to one of said television channels; means coupling said index member and said rotor for rotation together; detents carried by said frame and positioned for alternate engagement with said index stations upon rotation of said index member relative to said detents; and means separate from said detents for rotating said index member to selectively position one of said detents in a desired index station.

12. A tuner for selecting one of a plurality of television channels comprising: a frame; continuously variable tuning components carried by said frame; a rotor rotatably mounted on said frame and controlling said components; a carrier member rotatable on said frame and having mounting means; a disc having a plurality of index stations, each corresponding to one of said television channels, said disc being carried by said mounting means; means coupling said carrier member and said rotor for rotation together; detents carried by said frame and positioned for engagement one at a time with said index stations upon rotation of said disc relative to said detents; and means for rotating said carrier member to selectively position one of said detents in a desired index station.

13. The tuner of claim 12 wherein said mounting means includes at least one stud extending outwardly from said carrier member, and said disc includes an opening through which said stud extends.

14. The tuner of claim 12 wherein said mounting means includes at least one stud extending outwardly from said carrier member, and said coupling means includes a coupling plate secured to said rotor, said plate having an opening through which said stud extends.

15. A tuner for selecting one of a plurality of television channels comprising: a frame; tuning components carried by said frame; a rotor rotatably mounted on said frame and adapted to control said components; a disc having a plurality of index stations, each corresponding to one of said television channels; means coupling said disc and said rotor for rotation together; a detent carried by said frame, positioned for engagement with said index stations upon rotation of said disc relative to said detent; a fine tuning shaft rotatably mounted in said frame; drive means mounted on said fine tuning shaft for rotation therewith; means for rotating said disc to position said detent in a desired index station including, a broad tuning shaft concentric with said fine tuning shaft, a drive gear on said broad tuning shaft, a stationary gear mounted on said frame, an indicator shaft concentric with said broad and fine tuning shafts and having a planet gear meshing with said drive gear and with said stationary gear, so that said indicator shaft is rotated upon rotation of said broad tuning shaft, and means mounting said disc for rotation with said indicator shaft so that upon rotation of said broad tuning shaft said index disc and said rotor are rotated; and driven means carried by said indicator shaft and engaging said drive means, said driven means being coupled to said rotor so that upon rotation of said fine tuning shaft said rotor is rotated.

16. A tuner for selecting one of a plurality of television channels comprising: a frame; tuning components carried by said frame; a rotor rotatably mounted on said frame and adapted to control said components; a disc having a plurality of index stations, each corresponding to one of said television channels; means coupling said disc and said rotor for rotation together; detents carried by said frame, each detent being positioned for alternate engagement with said index stations upon rotation of said disc relative to said detents; a fine tuning shaft rotatably mounted in said frame; a frictional drive member mounted on said fine tuning shaft for rotation therewith; means for rotating said disc to position one of said detents in a desired index station including, a broad tuning shaft concentric with said fine tuning shaft, a drive gear on said broad tuning shaft, a stationary gear mounted on said frame, an indicator shaft concentric with said broad and fine tuning shafts and having a planet gear meshing with said drive gear and with said stationary gear, so that said indicator shaft is rotated upon rotation of said broad tuning shaft, and means mounting said disc for rotation with said indicator shaft so that upon rotation of said broad tuning shaft said index disc and said rotor are rotated; and a frictionally driven member carried by said indicator shaft and engaging said drive member, said driven member being coupled to said rotor so that upon rotation of said fine tuning shaft said rotor is rotated.

17. A tuner for selecting one of a plurality of television channels comprising: a frame; tuning components carried by said frame; a rotor rotatably mounted on said frame and adapted to control said components; an index disc having a plurality of index stations, each corresponding to one of said television channels; means coupling said disc and said rotor for rotation together; detents carried by said frame, each detent being positioned for engagement one at a time with each of said index stations upon rotation of said disc relative to said detents; a fine tuning shaft rotatably mounted in said frame; a drive member in the form of a pair of closely adjacent discs formed of high frictional material mounted on said fine tuning shaft for rotation therewith; means for rotating said disc to selectively position one of said detents in a desired index station including, a broad tuning shaft concentric with said fine tuning shaft, a drive gear on said broad tuning shaft, a stationary gear mounted on said frame in concentric relation with said broad and fine tuning shafts, an indicator shaft concentric with said broad and fine tuning shafts and having a planet gear meshing with said drive gear and with said stationary gear, so that said indicator shaft is rotated upon rotation of said broad tuning shaft, and means mounting said index disc for rotation with said indicator shaft so that upon rotation of said broad tuning shaft said index disc and said rotor are rotated; and a frictionally driven member carried by said indicator shaft and positioned between said drive discs, said driven member being coupled to said rotor so that upon rotation of said fine tuning shaft said rotor is rotated.

18. A tuner for selecting one of a plurality of television channels comprising: a frame; tuning components carried by said frame; a rotor rotatably mounted on said frame and adapted to control said components; an apertured index disc having a plurality of index stations, each corresponding to one of said television channels; a pair of detents carried by said frame, each detent being positioned for alternate engagement with each of said index stations upon rotation of said disc relative to said detents; a fine tuning shaft rotatably mounted in said frame; drive means mounted on said fine tuning shaft for rotation therewith; means for rotating said disc to position one of said detents in a desired index station including, a broad tuning shaft concentric with said fine tuning shaft, a drive gear on said broad tuning shaft, a stationary gear mounted on said frame, an indicator shaft concentric with said broad and fine tuning shafts and having a planet gear meshing with said drive gear and with said stationary gear, so that said indicator shaft is rotated upon rotation of said broad tuning shaft, and a pair of studs extending outwardly from one face of said indicator shaft and each received in one of said disc apertures to mount said disc for rotation with said indicator shaft; a coupling disc having radial slots, at least one of said studs being received in one of said slots; a pair of studs extending outwardly from said rotor and each received in others of said slots, so that upon rotation of said broad tuning shaft said rotor is rotated; and driven means carried by said indicator shaft and engaging said drive means, said means being coupled to said rotor so that upon rotation of said fine tuning shaft said rotor is rotated.

19. A tuner for selecting one of a plurality of television channels comprising: a frame; tuning components carried by said frame; a rotor rotatably mounted on said frame and adapted to control said components; an apertured index disc having a plurality of index stations, each corresponding to one of said television channels; detents carried by said frame, each detent being positioned for alternate engagement with said index stations upon rotation of said disc relative to said detents; a fine tuning shaft rotatably mounted in said frame; a drive member mounted on said fine tuning shaft for rotation therewith; means for rotating said disc to position one of said detents in a desired index station including, a broad tuning shaft concentric with said fine tuning shaft, a drive gear on said broad tuning shaft, a stationary gear mounted on said frame, an indicator shaft concentric with said broad and fine tuning shafts and having a planet gear meshing with said drive gear and with said stationary gear, so that said indicator shaft is rotated upon rotation of said broad tuning shaft, and a pair of studs extending outwardly from one face of said indicator shaft and each extending through said index disc apertures to mount said disc for rotation with said indicator shaft; a coupling disc having radial slots, one of said studs being received in one of said slots; a pair of further studs extending outwardly from said rotor and each received in another of said slots, so that upon rotation of said broad tuning shaft said rotor is rotated; and driven means carried by the other of said indicator shaft studs and engaging said drive means, said driven means being coupled to said rotor so that upon rotation of said fine tuning shaft said rotor is rotated.

20. An indexing device comprising: a support; a disc mounted on said support for rotation in opposite directions, said disc having a plurality of peripheral index stations; detent members non-rotatably mounted on said support, said detent members being positioned for alternate engagement with said index stations upon relative movement between said disc and said detent members; and means separate from said detent members for rotating said disc to position one of said detent members in a desired index station, said detent members being defined by spaced spring fingers which extend generally tangentially to said disc and are urged into engagement with the periphery thereof.

21. The indexing device of claim 20 wherein each finger includes an abutment for engaging said index stations, said abutments being spaced from one another so that said fingers alternately engage said index stations.

References Cited by the Examiner

UNITED STATES PATENTS

| | | | |
|---|---|---|---|
| 2,119,111 | 5/1938 | Minkowitz | 74—142 |
| 2,604,791 | 7/1952 | Daly | 74—10.41 |
| 2,777,336 | 1/1957 | Schonstedt | 74—527 |
| 3,150,338 | 9/1964 | Weiner | 74—10.41 X |
| 3,152,487 | 10/1964 | Kennedy | 74—10.41 |
| 3,188,871 | 6/1965 | Mentzer | 74—10 |
| 3,205,720 | 9/1965 | Smith | 74—10.8 |
| 3,234,801 | 2/1966 | Valdettaro et al. | 74—10.41 |

References Cited by the Applicant

UNITED STATES PATENTS

| | | |
|---|---|---|
| 2,771,547 | 1956 | Bell et al. |
| 2,873,610 | 1959 | Williams. |
| 2,970,481 | 1961 | Summerer. |

MILTON KAUFMAN, *Primary Examiner.*